United States Patent
Gardner et al.

[11] Patent Number: 6,015,739
[45] Date of Patent: Jan. 18, 2000

[54] METHOD OF MAKING GATE DIELECTRIC FOR SUB-HALF MICRON MOS TRANSISTORS INCLUDING A GRADED DIELECTRIC CONSTANT

[75] Inventors: Mark I. Gardner, Cedar Creek; H. Jim Fulford; Dim-Lee Kwong, both of Austin, all of Tex.

[73] Assignee: Advanced Micro Devices, Sunnyvale, Calif.

[21] Appl. No.: 08/959,796

[22] Filed: Oct. 29, 1997

[51] Int. Cl.[7] .................................................. H01L 21/336
[52] U.S. Cl. ............................ 438/287; 438/591; 438/785
[58] Field of Search .................................... 438/216, 287, 438/591, 762, 763, 785, 791, 910

[56] References Cited

U.S. PATENT DOCUMENTS

| | | | |
|---|---|---|---|
| 5,319,226 | 6/1994 | Sohn et al. ................................. | 438/785 |
| 5,436,481 | 7/1995 | Egawa et al. .............................. | 438/287 |
| 5,464,792 | 11/1995 | Tseng et al. .............................. | 438/591 |
| 5,834,353 | 11/1998 | Wu ............................................ | 438/287 |

OTHER PUBLICATIONS

Ghandhi, S.K., "VLSI Fabrication Principles, Silicon and Gallium Arsenide", pp. 372–373, 427–430, 1983.

*Primary Examiner*—Chandra Chaudhari
*Attorney, Agent, or Firm*—Joseph Lally; Dewan & Lally, L.L.P.

[57] ABSTRACT

A process for fabricating a gate dielectric stack of a MOS transistor. A native oxide film is formed on an upper surface of a semiconductor substrate. A silicon nitride layer is then deposited on the native oxide film. A final dielectric film is then formed on the silicon nitride film. A dielectric constant of the final dielectric film is in the range of approximately 20–200. The substrate is then annealed in an inert ambient to produce the gate dielectric stack. An equivalent silicon dioxide thickness of the dielectric stack is typically in the range of approximately 5–20 angstroms whereby a gate dielectric stack suitable for use in deep sub-micron transistor is fabricated with a film thickness substantially in excess of an electrically equivalent silicon dioxide film. A suitable material for the final dielectric film includes oxides comprising oxygen and an element such as beryllium, magnesium, calcium, zirconium, titanium, or tantalum.

17 Claims, 2 Drawing Sheets

METHOD OF MAKING GATE DIELECTRIC FOR SUB-HALF MICRON MOS TRANSISTORS INCLUDING A GRADED DIELECTRIC CONSTANT

BACKGROUND OF THE INVENTION

1. Field of the Invention

The present invention relates to the field of semiconductor processing, and more particularly to a MOS Transistor including a gate dielectric stack comprised of materials having various dielectric constants to produce a graded dielectric stack.

2. Description of the Relevant Art

The fabrication of MOS (metal-oxide-semiconductor) transistors is well known. Typically, a silicon substrate is divided into a plurality of active and isolation regions through an isolation process. After appropriate cleaning of the substrate surface, a thin gate oxide is then grown on an upper surface of the substrate over the active regions. Next, a plurality of polysilicon gates are formed on the gate oxide layer. Each gate traverses an active region of the substrate thereby effectively dividing the active region into a pair of regions referred to as source/drain regions. After formation of the polysilicon gates, the source/drain regions are implanted with an impurity concentration sufficient to render the source/drain regions conductive. The implantation of the source/drain regions after the formation of the polysilicon gate insures that the gate is self aligned to the source/drain regions and, consequently, to the device channel region as well.

As transistor channel lengths fall below 0.5 microns, the limitations of conventional transistor processing become more apparent. In particular, short channel effects emerge as a problem for transistors with channel lengths of less than approximately 2 microns. For devices of this size, the depletion regions around the negatively biased drain/substrate and source/substrate junctions during normal circuit operation begin to approach a size comparable to the channel length. Under these circumstances, the transistor drain current fails to saturate (i.e., the drain current is a function of drain voltage regardless of the drain voltage value), sub-threshold leakage begins to exhibit a dependence on the drain voltage, and the threshold voltage exhibits dependence on the transistor geometries and the specific biasing conditions. From experimental data, it has been observed that the onset of short channel behavior is, to a first order approximation for a given starting material under a given set of biasing conditions, a function of the junction depth and the thickness of the gate oxide. See, e.g., Sze, *Physics of Semiconductor Devices* p. 471 (Wiley & Sons 1981). Accordingly, semiconductor manufacturers typically attempt to simply scale the dimensions of these parameters to achieve smaller channel length devices without incurring significant short channel behavior.

The preceding discussion indicates that increasingly thin gate oxide films are required to maintain adequate performance in deep sub-micron transistors. Thin gate oxides, however, are difficult to consistently manufacture and are susceptible to reliability problems. Typically, the maximum electric field that may be sustained across an oxide film without resulting in oxide breakdown is in the vicinity of approximately 6 MV/cm. If a particular process is designed to operate with a 3.3 V gate voltage, oxide films of less than approximately 55 angstroms in thickness may be susceptible to reliability problems. This minimum oxide thickness imposes a significant restraint on transistor performance in the deep sub-micron region.

In addition to manufacturing and reliability concerns presented by thin oxides, the migration of mobile contaminants across the gate oxide film and into active regions of the device increases as oxide thickness decreases. This problem is especially acute for boron implanted gate structures typically associated with p-channel transistors because of the relatively high rate at which boron atoms tend to diffuse through an oxide film. Because boron atoms are p-type dopants in a silicon lattice, excessive boron migration into the channel region of the transistor can result in a measurable and undesirable shift in threshold voltage for p-channel transistors.

Therefore, it would be highly desirable to implement a process for manufacturing MOS transistors that eased the concerns associated with thin oxide films without degrading transistor performance or subthreshold leakage.

SUMMARY OF THE INVENTION

The problems identified above are in large part addressed by a semiconductor manufacturing process in which an MOS transistor is fabricated with multi-layer gate dielectric including materials of varying dielectric constants to produce a dielectric stack with a graded dielectric profile. Preferably, the thickest layer of the dielectric stack has the greatest dielectric constant such that the equivalent oxide thickness of the dielectric stack is minimized without requiring an extremely thin dielectric layer. By utilizing a thicker dielectric, problems associated with the formation of ultra thin (i.e., less than approximately 50 angstroms) silicon dioxide films are avoided without incurring significant performance penalties.

Broadly speaking, the present invention contemplates a process for fabricating a gate dielectric stack of MOS transistor in which a native oxide film is formed on an upper surface of a semiconductor substrate. A silicon nitride layer is then deposited on the native oxide film. A final dielectric film is then formed on the silicon nitride film. A dielectric constant of the final dielectric film is in the range of approximately 20–200. The semiconductor substrate is then annealed in an inert ambient to form a dielectric stack comprised of the native oxide film, the silicon nitride layer, and the final dielectric film.

Preferably, the formation of the native oxide film is accomplished by immersing the semiconductor substrate in an oxygen bearing ambient, maintained at a temperature in the range of approximately 15–200° C. for a duration in the range of approximately 10 seconds to 20 minutes. A thickness of the native oxide film is preferably about 5 angstroms. A dielectric constant of the native oxide film is preferably in the range of approximately 4.0–4.2. In a presently preferred embodiment, the deposition of the silicon nitride film is accomplished by decomposing silane and ammonium in a CVD reactor chamber maintained at a temperature in a range of approximately 200–800° C. and a pressure of less than approximately 2 torrs. The thickness of the silicone nitride film is preferably in the range of approximately 10–20 angstroms. In this embodiment, a dielectric constant of the silicon nitride film is in the range of approximately 8–9. Thus, an equivalent oxide thickness of the silicon nitride film is preferably in the range of approximately 5–10 angstroms. In the preferred embodiment, the formation of the final dielectric film is accomplished by depositing a dielectric material comprised of oxygen and an element selected from the group including Be, Mg, Ca, Zr, Ti, and Ta. In this embodiment, the incorporation of one or more the indicated elements into an oxygen compound results in a dielectric film with a dielectric constant in the range of approximately 20–200. The thickness of the final dielectric film is preferably in the range of approximately 20–500 angstroms. An equivalent oxide thickness of the dielectric film is preferably in the range of approximately 5–15 angstroms. Accordingly, an equivalent oxide thickness for the dielectric stack is preferably in the range of 5–25 angstroms. The annealing of the semiconductor substrate is preferably accomplished by immersing the semiconductor substrate in an inert ambient maintained at a temperature in the range of approximately 600–1100° C. for a duration in the range of approximately 2–20 minutes.

The present invention still further contemplates a process performing a graded dielectric stack for use as a gate dielectric film of MOS transistor. A first dielectric film is formed on an upper surface of the semiconductor substrate. The first dielectric film has a first thickness and a first dielectric constant. A second dielectric film is then formed on the first dielectric film. The second dielectric film comprises a second thickness and a second dielectric constant. A third dielectric film is then formed on another surface of the second dielectric film. The third dielectric film includes a third thickness and a third dielectric constant. The first, second, and third dielectric films are then annealed along with the semiconductor substrate by immersing the semiconductor substrate into an inert ambient maintained at a temperature in the range of approximately 600–1100° C.

Preferably, the second thickness and the second dielectric constant are greater than the first thickness and the first dielectric constant respectively. Still further preferably, the third thickness and the third dielectric constant are greater than the second thickness and the second dielectric constant respectively. In one embodiment, an equivalent oxide thickness of the first, second, and third dielectric films are each in the range of 5–15 angstroms. The first dielectric film preferably comprises a silicon dioxide film having a thickness of approximately 5 angstroms. In one embodiment, the second dielectric film includes a nitrogen bearing species. In one embodiment, the second dielectric film comprises silicon nitride. In this embodiment, a thickness of the second dielectric film is in the range of approximately 10–20 angstroms. Preferably, the third dielectric constant is in the range of approximately 10–200, and the third thickness is in the range of approximately 25–250 angstroms. In a presently preferred embodiment, the third dielectric film is an oxide comprising oxygen and a dielectric impurity such as Be, Mg, Ca, Ti, Zr, or Ta.

In one embodiment, the process further includes the formation of a conductive gate layer on an upper surface of the gate dielectric stack. In this embodiment, a sheet resistivity of the conductive gate layer is less than approximately 15 Ω/square. The conductive gate layer is then patterned to form a conductive gate electrode. The conductive gate electrode is aligned over a channel region of the semiconductor substrate. A source/drain impurity distribution is then implanted into the semiconductor substrate using the conductive gate electrode as a implant mask such that the source/drain impurity distribution is introduced into a pair of source/drain regions laterally displaced within the semiconductor substrate on either side of the channel region. Suitable elements useful for the introduction of the source/drain impurity distribution into the semiconductor substrate include boron, phosphorous, and arsenic.

The present invention still further contemplates a MOS transistor. The transistor includes a semiconductor substrate comprising a channel region laterally displaced between a pair of source/drain regions. A gate dielectric stack is formed on an upper surface of the semiconductor substrate. The gate dielectric stack includes a first dielectric film, a second dielectric film, and a third dielectric film. The first dielectric film is formed on an upper surface of the semiconductor substrate. The first dielectric film has a first dielectric constant and comprises a first thickness. The second dielectric film is formed on an upper surface of the first dielectric film. The second dielectric film has a second dielectric constant and a second thickness. A third dielectric film is located on an upper surface of the second dielectric film. The third dielectric film includes a third thickness and has a third dielectric constant. The transistor further includes a conductive gate electrode located on an upper surface of the gate dielectric stack. The conductive gate electrode is aligned over the channel region of the semiconductor substrate. A pair of source/drain electrodes is located within a pair of source/drain regions respectively of the semiconductor substrate. Each of the source/drain electrodes includes a source/drain impurity distribution. A peak concentration of the source/drain impurity distribution is in excess of approximately $1 \times 10^{19}$ atoms/cm$^3$.

Preferably, the semiconductor substrate includes a p-type epitaxial layer formed on a p+ silicon bulk. A resistivity of the epitaxial layer is preferably in the range of approximately 10–15 Ω-cm. In a presently preferred embodiment, the first dielectric film comprises a silicon dioxide and has a thickness of approximately 5 angstroms. In one embodiment, the second dielectric film comprises silicon nitride having a thickness in the range of approximately 10–20 angstroms. In one embodiment, the third dielectric film is an oxide comprised of oxygen and a dielectric impurity such as Be, Mg, Ca, Ti, Zr, and Ta. In the preferred embodiment, the conductive gate electrode comprises polysilicon. The polysilicon includes an impurity distribution sufficient to reduce a sheet resistivity of the polysilicon to less than approximately 50 Ω/square.

BRIEF DESCRIPTION OF THE DRAWINGS

Other objects and advantages of the invention will become apparent upon reading the following detailed description and upon reference to the accompanying drawings in which.

Figure 1:
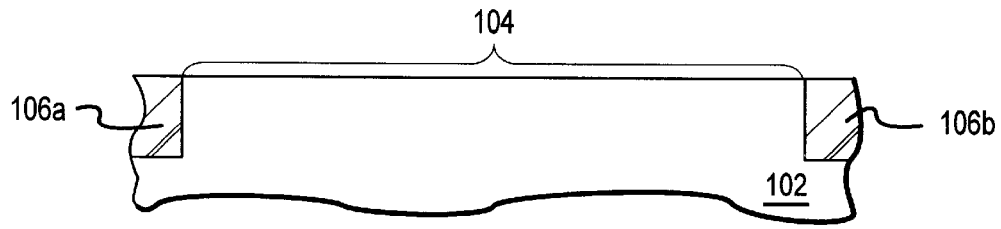
FIG. 1 is a partial cross section or view of a semiconductor substrate including an active region laterally displaced between a pair of isolation structures.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 5:
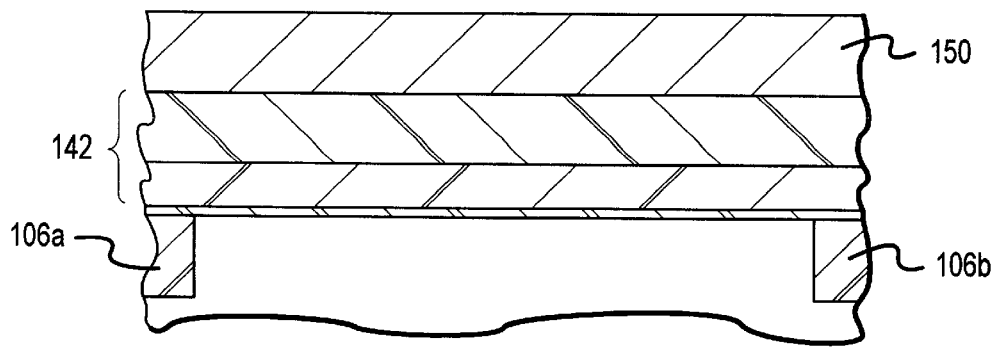
FIG. 5 is a processing step subsequent to FIG. 4 in which a conductive gate layer is deposited upon the gate dielectric stack comprised of the first, second, and third dielectric films.
Figure 6:
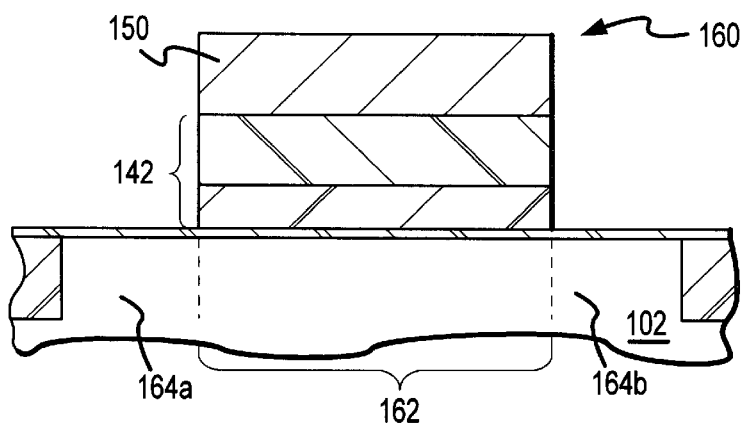
FIG. 6 is a processing step subsequent to FIG. 5 in which the conductive gate layer is patterned to form a conductive gate electrode aligned over a channel region of the semiconductor substrate.
Figures 7, 7A:
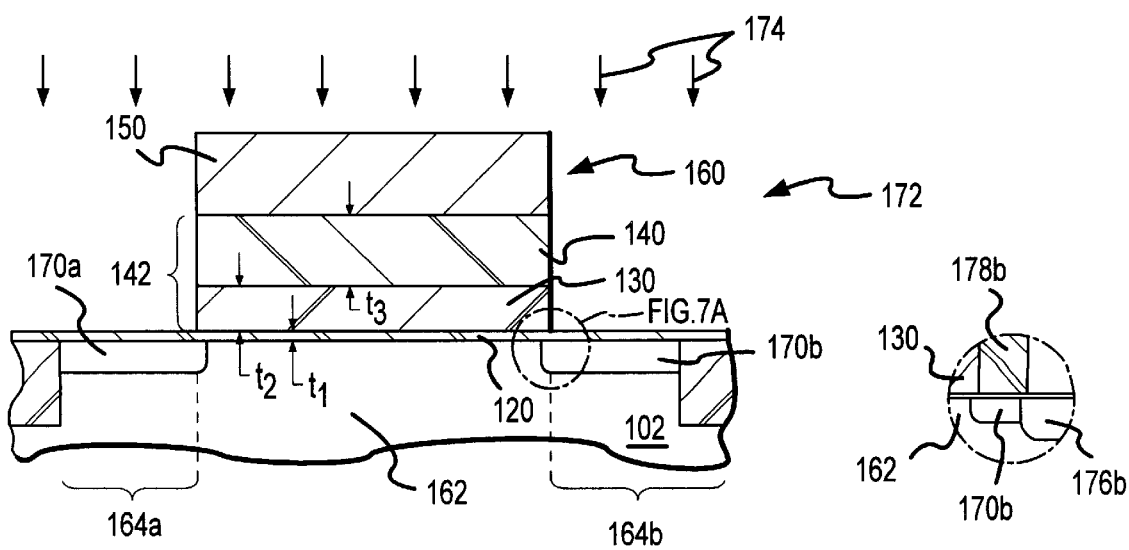
FIG. 7 is a processing step subsequent to FIG. 6 in which source/drain electrodes are formed within source/drain regions laterally displaced on either side of the channel region of the semiconductor substrate.

Turning now to the drawings, FIGS. 1–7 depict a preferred sequence for fabricating a MOS transistor 172 (shown in FIG. 7). Transistor 172 includes a semiconductor substrate 102 comprised of a channel region 162 laterally displaced between a pair of source/drain regions 164a and 164b. In a presently preferred embodiment, semiconductor substrate 102 comprises a p-type epitaxial layer formed on a p+ silicon bulk. A preferred resistivity of the epitaxial layer is in the range of approximately 10 to 15 Ω-cm. Transistor 172 further includes a gate dielectric stack 142 that is formed on an upper surface of semiconductor substrate 102. Gate dielectric stack 142 includes a first dielectric film 120, formed on an upper surface of semiconductor 102. First dielectric film 120 has a first thickness $t_1$ and a first dielectric constant. A second dielectric film 130 is formed on an upper surface of first dielectric film 120. Second dielectric film 130 has a second thickness $t_2$ and a second dielectric constant. Gate dielectric stack 142 further includes a third dielectric film 140 formed on an upper surface of second dielectric film 130. Third dielectric film 140 has a third thickness $t_3$ and a third dielectric constant. A conductive gate electrode 160 is formed on gate dielectric stack 142. Conductive gate electrode 160 is aligned over the channel region 162 of semiconductor substrate 102. Transistor 172 also includes a pair of source/drain electrodes 170a and 170b (collectively referred to as source/drain electrodes 170. The source/drain electrodes 170 include a source/drain impurity distribution having a peak concentration in excess of approximately $1 \times 10^{19}$ atoms/cm$^3$.

Preferably, first dielectric film 120 comprises a silicon oxide film and has a thickness in the range of approximately 5 angstroms. Second dielectric film 130 preferably comprises a silicon nitride film having a thickness in the range of approximately 10–20 angstroms. Third dielectric film 140 preferably comprises a dielectric material having a dielectric constant in the range of approximately 20–200 angstroms, and a dielectric constant in the range of approximately 25–300. In the preferred embodiment, third dielectric film 140 comprises an oxygen compound combining oxygen with an element such as beryllium (Be), magnesium (Mg), calcium (Ca), titanium (Ti), zirconium (Zr), or tantalum (Ta). In a presently preferred embodiment, conductive gate electrode 160 comprises a heavily doped polysilicon having a sheet resistivity of less than approximately 50 Ω/square.

Preferably, a lateral dimension of channel region 162 is in the range of approximately 0.1–0.5 microns. It is theorized that the present invention beneficially incorporates a relatively thick third dielectric film 140 into the gate dielectric stack 142 to eliminate the difficulties associated with fabricating deep sub-micron transistors with ultra thin (i.e., less than approximately 50 angstroms) silicon dioxide film. By incorporating a third dielectric film 140 with a relatively high dielectric constant, the dielectric stack 142 has an equivalent silicon dioxide thickness in the range of approximately 5–15 angstroms. (For purposes of this disclosure, an equivalent thickness of a dielectric film is calculated by dividing the thickness of the dielectric film by the ratio of the film's dielectric constant to the dielectric constant of silicon dioxide.) By using high K materials (i.e. materials with a dielectric constant greater than the dielectric constant of silicon dioxide) for the third dielectric film 140 of dielectric stack 142, the equivalent thickness of dielectric stack 142 is minimized in order to facilitate the fabrication of short channel devices (i.e., devices having a channel length of less than approximately 1 micron), without incurring significant short channel effects. In addition, the present invention contemplates the use, in the preferred embodiment, of a second dielectric film 130 comprised of silicon nitride. Silicon nitride, in addition to having a dielectric constant approximately twice as great as the dielectric constant of a silicon dioxide film, also beneficially provides a barrier layer that will substantially prevent mobile impurities within conductive gate electrode 160 and third dielectric film 140 from migrating into the channel region 162 of transistor 172. This barrier property of the preferred embodiment of second dielectric film 130 improves reliability by substantially preventing the shifts in threshold voltage associated with the migration of mobile impurities, the most notable of which is the migration of mobile boron atoms within the gate electrodes of p-channel devices. Accordingly, transistor 172 represents a deep sub-micron transistor which has a relatively thick dielectric stack to facilitate the fabrication of the device without incurring the short channel effects typically associated with thick dielectric films in sub-micron transistors. While simultaneously including a barrier layer to prevent the migration of mobile contaminants.

Turning now to FIGS. 1–7, a preferred processing sequence is shown for the fabrication of transistor 172. In FIG. 1, a semiconductor substrate 102 is provided. Semiconductor substrate 102 includes an active region 104 laterally displaced between a pair of isolation structures 106a and 106b. Active region 104 represents areas of semiconductor substrate 102 into which active devices such as transistors will ultimately be fabricated. The isolation structures 106, as will be familiar with those skilled in the art of semiconductor processing, provide electrical and physical separation and isolation between neighboring active regions 104 to prevent inadvertent coupling of neighboring active regions. In the embodiment shown in FIG. 1, the isolation structures 106 are of the shallow trench variety. Shallow trench isolation structures are typically fabricated by etching a trench into the semiconductor substrate 102 and, thereafter, filling the trench with a dielectric material such as a CVD oxide and planarizing to remove portions of the CVD film exterior to the isolation trench. It will be appreciated to those skilled in the art that alternative isolation structures such as the well known LOCOS isolation structures may be suitably substituted for the shallow trench isolation structures 106 shown in FIG. 1. A suitable starting material for semiconductor substrate 102 includes a single crystal silicon wafer of a diameter in the range of approximately 100–250 mm. In an embodiment useful in the fabrication of CMOS devices, the single crystal silicon substrate may preferably include a p-type epitaxial layer formed over a p+ silicon bulk. A suitable resistivity of the p-type epitaxial layer in this embodiment is in the range of approximately 10–15 Ω-cm.

Figure 2:
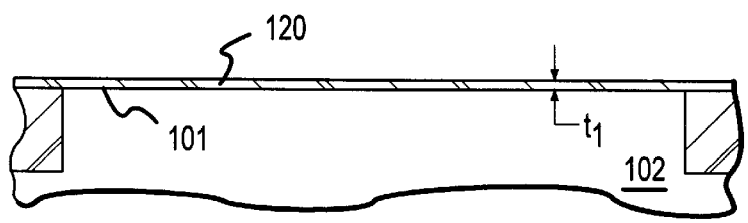
FIG. 2 depicts a processing step subsequent to FIG. 1 in which a first dielectric film such as a native silicon dioxide film is formed on an upper surface of the semiconductor substrate.

Turning now to FIG. 2, a first dielectric film 120 is formed on an upper surface 101 of semiconductor substrate 102. In the presently preferred embodiment, first dielectric film 120 comprises a native oxide film having a first thickness $t_1$ in the range of approximately 5 angstroms. In this embodiment, the formation of native oxide film 120 preferably comprises exposing semiconductor substrate 102 to an oxygen bearing ambient maintained at a temperature in the range of approximately 15–200° C. for a duration in the range of approximately 10 seconds to 20 minutes. It will be appreciated that native oxide films such as native oxide film 120 form naturally on a silicon substrate when exposed to an oxygen bearing ambient such as the air found in a typical fabrication facility. The present invention contemplates the controlled and deliberate formation of a native oxide film to form the first layer of a dielectric stack. The thickness of the native oxide film 120 may be controlled by controlling the conditions under which semiconductor substrate 102 is exposed to the oxygen bearing ambient and, thereafter, either directly loading semiconductor substrate 102 into the subsequent processing step or storing semiconductor substrate 102 in an inert ambient to prevent further formation of the native oxide film 120. As a silicon dioxide film, native oxide film 120 has a dielectric constant in the range of approximately 3.9–4.2.

Figure 3:
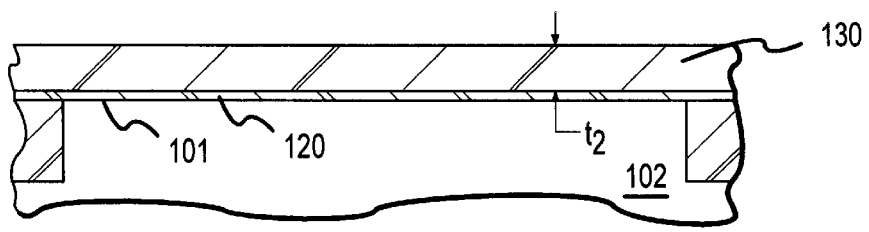
FIG. 3 is a processing step subsequent to FIG. 2 in which a second dielectric film such as a silicon nitride film is deposited on the first dielectric film.

Turning now to FIG. 3, a second dielectric film 130 is formed on an upper surface of first dielectric film 120. The second dielectric film has a second thickness $t_2$ and a second dielectric constant. Preferably, the second thickness $t_2$ is greater than the first thickness $t_1$ and the second dielectric constant of second dielectric film 130 is greater than first dielectric constant of the first dielectric film 120. In one presently preferred environment, second dielectric film 120 has an equivalent silicon dioxide thickness of approximately 5 angstroms. In one embodiment, the second dielectric film 130 comprises a silicon nitride film. In this embodiment, the formation of second dielectric film 130 is preferably performed by decomposing silane and ammonium in a CVD reactor chamber maintained at a temperature in the range of approximately 200–800° C. and a pressure of less than approximately 2 torrs. In this embodiment, it will be appreciated that the second dielectric constant of second dielectric 130 is roughly twice the dielectric constant of the native oxide film 120. In the preferred embodiment, a thickness of the silicon nitride film 130 is preferably in the range of approximately 10–20 angstroms. In such an embodiment, an equivalent oxide thickness of the silicon nitride film is in the range of approximately 5–10 angstroms. In the embodiment of the present invention incorporating silicon nitride as the second dielectric film 130, it will be appreciated that native oxide film 120 provides a pad layer to prevent the silicon nitride film from inducing stress fractures in semiconductor substrate 102. It will be appreciated to those skilled in the art that the deposition of a silicon nitride film directly on an exposed silicon lattice can result in damage to the lattice due to the tensile stress imparted to the silicon substrate by the nitride film.

Figure 4:
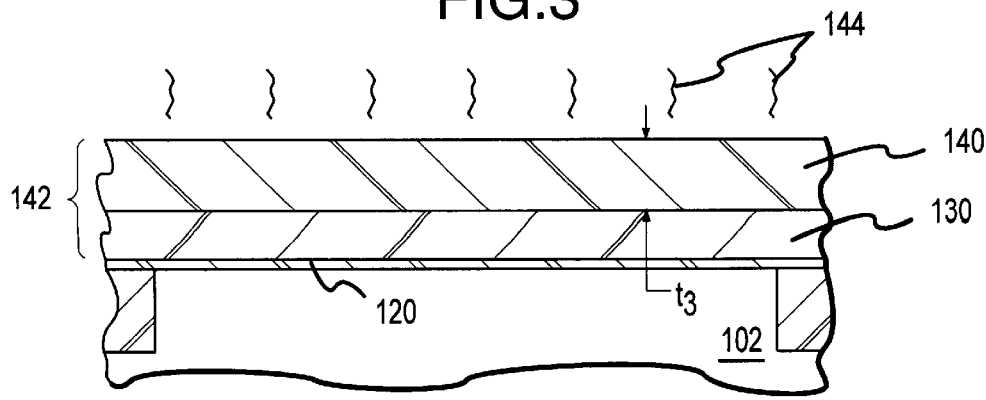
FIG. 4 is a processing step subsequent to FIG. 3 in which a third dielectric film is formed on the second dielectric film.

Turning now to FIG. 4, the dielectric stack 142 is completed by forming a third and final dielectric film 140 on an upper surface of the second dielectric film 130. A dielectric constant of the third dielectric film 140 is preferably in the range of approximately 20–200. Preferably, the material used to achieve dielectric constants in this range include oxygen compounds in which Be, Mg, Ca, Zr, Ti, Ta, or other suitable material is incorporated into the final dielectric film 140 to produce an oxide with a relatively high dielectric constant. Accordingly, a suitable material for the third dielectric film 140 includes, for example, $Be_xO_y$, $Mg_xO_y$, $Ca_xO_y$, $ZrO_2$, $TiO_2$, or $Ta_2O_5$. In the preferred embodiment, a thickness of the final dielectric film 140 is in the range of approximately 20–500 angstroms. By incorporating a high K dielectric material into the final dielectric film 140, an equivalent oxide thickness of the third dielectric 140 is in the range of approximately 5–10 angstroms in the presently preferred embodiment. The third and final dielectric film 140 may be suitably formed on the second dielectric film with a CVD process, a plasma enhanced CVD process, a sputter deposition or other PVD process, or other suitable deposition process. In an embodiment of the present invention in which the third and final dielectric film 140 is deposited with a CVD process, an oxygen bearing source, and a source comprising Be, Mg, Ca, Zr, Ti, or Ta, is introduced into a CVD reactor chamber maintained at a temperature and range of approximately 200–800° C., and a pressure of less than approximately 2 torr. In a sputter deposition process, a target comprising oxygen and one of the suitable materials mentioned previously is bombarded with energetic ions to produce oxygen compound particles which are then directed towards the semiconductor substrate with an electric field as will be appreciated familiar with sputter deposition processes.

After the formation of dielectric stack 142, the semiconductor substrate 102 is preferably annealed in an inert ambient. The preferred process for annealing the semiconductor substrate and the dielectric stack includes immersing the semiconductor substrate into an inert ambient maintained at a temperature in the range of approximately 600–1100° C. for a duration in the range of approximately 2–20 minutes. A suitable inert ambient may comprise nitrogen, argon, or other suitable inert material. The anneal process described is represented in FIG. 4 by reference numeral 144. It is theorized that the anneal process 144 will improve the reliability of dielectric stack 142 by minimizing the quantity or density of trapped and fixed charges at the interfaces between the various dielectric layers that comprise dielectric stack 142. Anneal process 144 may further improve the reliability of dielectric stack by achieving a densification of the various dielectric layers.

Turning now to FIG. 5, a conductive gate layer 150 is formed on an upper surface of dielectric stack 142. In the preferred embodiment, the conductive gate layer 150 comprises polysilicon preferably deposited by thermally decomposing silane in a CVD reactor chamber maintained at a temperature in the range of approximately 580–650° C. In an embodiment in which conductive gate layer 150 comprises polysilicon, an impurity distribution is typically introduced into the polysilicon layer through an ion implantation process designed to reduce a sheet resistivity of conductive gate layer 150 to less than approximately 50 Ω/square. Suitable impurities for the doping of polysilicon layer 150 include phosphorous, boron, and arsenic. In embodiments in which it is suitable to achieve an even lower resistivity of the conductive gate layer, other materials such as aluminum, copper, tungsten, or other suitable conductive material may be used as conductive gate layer 150. In the embodiment in which conductive gate layer 150 comprises polysilicon, a thickness of conductive gate layer 150 is preferably in the range of approximately 100–3000 angstroms.

Turning now to FIG. 6, an etch process is performed after fabricating a patterned mask (not shown in the drawings) on an upper surface of the conductive gate layer 150 to remove portions of the conductive gate layer and the underlying dielectric stack not protected by the patterned mask. Mask and etch processes, as described, and are well known to those in the field of semiconductor processing. In one embodiment, the etch process incorporates a plasma etch designed to etch the conductive gate layer 150 and the dielectric stack 142 in an anisotropic fashion to produce substantially vertical sidewalls of the conductive gate electrode 160. Preferably, conductive gate electrode 160 is aligned over channel region 162 of semiconductor substrate 102. Channel region 162 of semiconductor substrate 102 is laterally displaced between a pair of source/drain regions 164a and 164b. Together, the source/drain regions 164 and channel region 162 comprise the active region 104 of semiconductor substrate 102. It will be appreciated to those familiar with self-aligned processes that conductive gate electrode 160 is self-aligned to channel region 162 because the channel region is defined by a subsequent implant which uses the conductive gate electrode 160 as an implant mask. In this manner, no misalignment occurs between the channel region 162 and the conductive gate electrode 160.

Turning now to FIG. 7, the MOS transistor 172 is completed by introducing a source/drain impurity distribution into source/drain regions 164 of semiconductor substrate 102, preferably through the use of an ion implantation process represented in FIG. 7 by reference numeral 174 to produce source/drain electrodes 170a and 170b, laterally displaced within semiconductor substrate 102 on either side of channel region 162. In the preferred embodiment, a suitable dose for ion implantation process 174 is in the range of approximately $1 \times 10^{13}$ to $5 \times 10^{15}$ atoms/cm$^2$. A suitable implant energy used for ion implantation 174 is in the range of approximately 5–200 keV. Those familiar with MOS transistors will appreciate that multiple ion implantation processes similar to ion implantation process 174 may be carried out to produce a graded source/drain electrodes 170. In one well known alternative, for example, spacer structures may be fabricated on the side walls of conductive gate electrode 160 and dielectric stack 142 after introducing a first source/drain impurity distribution into semiconductor substrate 102. A second source/drain impurity distribution, typically with a higher dose and a higher energy, is then introduced into semiconductor substrate 102 using the spacer structures to laterally displace the second impurity distribution from the existing impurity distribution from the existing impurity distribution. Those familiar with submicron transistor design will appreciate that the described sequence will result in lightly doped source/drain structures that extend to the boundaries of the channel region 162, and heavily doped source/drain impurity distributions which are displaced away from the channel region 162. This well known combination of source/drain impurity distributions, referred to as the LDD structure, beneficially reduces the maximum electric field that is generated proximal to the channel region 162 during normal device operation. Accordingly, an alternative embodiment of transistor 172 may include a source/drain electrode which includes a lightly doped source/drain impurity distribution 170, and a heavily doped impurity distribution 176 as shown in the alternative view of FIG. 7. The heavily doped impurity distribution is laterally displaced from the channel region 162, preferably through the use of a spacer structure 178 formed on a side wall of dielectric stack 142. In addition to facilitating the formation of lightly doped regions, spacer structures are useful in producing self-aligned silicide structures. In an embodiment of the present invention in which silicide structures are contemplated, a suitable material for the spacer structures 178 includes a deposited dielectric such as a CVD oxide. Spacer structure 178 facilitates self-aligned silicide processes by preventing a silicide ribbon from connecting the conductive gate electrode 160 to the source/drain region 176.

It will be appreciated to those skilled in the art that the present invention represents a method and structure in which a high K dielectric is incorporated into a dielectric stack to produce a gate dielectric of a MOS transistor having a thickness substantially greater than a thickness of an equivalent silicon dioxide film. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. A process for fabricating a gate dielectric stack of an MOS transistor, said process comprising:

forming a native oxide film on an upper surface of a semiconductor substrate;

depositing a silicon nitride layer on said native oxide film;

forming a final dielectric film on said silicon nitride film, wherein a dielectric constant of said final dielectric film is in the range of approximately 20 to 200; and annealing said semiconductor substrate in an inert ambient, whereby said native oxide film, said silicon nitride layer, and said final dielectric film comprise said gate dielectric stack.

2. The process of claim 1, wherein the step of forming said native oxide film comprises exposing said semiconductor substrate to an oxygen bearing ambient maintained at a temperature in the range of approximately 15 to 200° C. for a duration in the range of approximately 10 seconds to 20 minutes.

3. The process of claim 2, wherein a thickness of said native oxide film is approximately 5 angstroms and further wherein a dielectric constant of said native oxide film is in the range of approximately 3.9 to 4.2.

4. The process of claim 1, wherein the step of depositing said silicon nitride film comprises decomposing silane and ammonium in a CVD reactor chamber maintained at a temperature in the range of approximately 200 to 800° C. and a pressure of less than approximately 2 torrs.

5. The process of claim 1, wherein a thickness of said silicon nitride film is in the range of approximately 10 to 20 angstroms and further wherein a dielectric constant of said silicon nitride film is in the range of approximately 8 to 9, whereby an equivalent oxide thickness of said silicon nitride film is in the range of approximately 5 to 10 angstroms.

6. The process of claim 1, wherein the step of forming said final dielectric film comprises depositing a dielectric material comprised of oxygen and a material selected from the group comprising Be, Mg, Ca, Zr, Ti, and Ta.

7. The process of claim 1, wherein a thickness of said final dielectric film is in the range of approximately 20 to 500 angstroms and wherein an equivalent oxide thickness of said dielectric film is in the range of approximately 5 to 10 angstroms.

8. The process of claim 1, wherein the step of annealing comprises immersing said semiconductor substrate in an inert ambient maintained at a temperature in the range of approximately 600 to 1100° C. for a duration in the range of approximately 2 to 20 minutes.

9. A process for forming a graded dielectric stack for use as a gate dielectric film of an MOS transistor, said process comprising:

forming a first dielectric film on an upper surface of a semiconductor substrate, said first dielectric film comprising a first thickness and a first dielectric constant;

forming a second dielectric film on said first dielectric film, said second dielectric film comprising a second dielectric constant and a second thickness;

forming a third dielectric film on an upper surface of said second dielectric film, wherein said third dielectric film comprises a third thickness and a third dielectric constant; and annealing said semiconductor substrate in an inert ambient maintained at a temperature in the range of approximately 600 to 1100° C.

10. The process of claim 9, wherein said second thickness and said second dielectric constant are greater than said first thickness and said first dielectric constant respectively, and further wherein said third thickness and said third dielectric constant are greater than said second thickness and said second dielectric constant respectively.

11. The process of claim 9, wherein equivalent oxide thicknesses of said first, second, and third dielectric films are all in the range of approximately 5 to 15 angstroms.

12. The process of claim 9, wherein said first dielectric comprises silicon dioxide and wherein said first thickness is approximately 5 angstroms.

13. The process of claim 9, wherein said second dielectric film comprises a nitrogen bearing species.

14. The process of claim 13, wherein said second dielectric film comprises silicon nitride and further wherein a thickness of said second dielectric film is in the range of approximately 10 to 20 angstroms.

15. The process of claim 9, wherein said third dielectric constant is in the range of approximately 20 to 200 and further said third thickness is in the range of approximately 25 to 250 angstroms.

16. The process of claim 9, wherein said third dielectric film comprises oxygen and an element selected from the group comprising Be, Mg, Ca, Ti, Zr, and Ta.

17. The process of claim 9, further comprising:

forming a conductive gate layer on an upper surface of said gate dielectric stack, wherein a sheet resistivity of said conductive gate layer is less than approximately 50 $\Omega$/square;

patterning said conductive gate layer to form a conductive gate electrode, wherein said conductive gate electrode is aligned over a channel region of said semiconductor substrate; and implanting a source/drain impurity distribution comprising boron, phosphorous, or arsenic into a pair of source/drain regions laterally displaced within said semiconductor substrate on either side of said channel region.

* * * * *